US00RE42040E

(19) United States
(12) Reissued Patent
Sakamoto et al.

(10) Patent Number: US RE42,040 E
(45) Date of Reissued Patent: Jan. 18, 2011

(54) SWITCHING ELEMENT METHOD OF DRIVING SWITCHING ELEMENT REWRITABLE LOGIC INTEGRATED CIRCUIT AND MEMORY

(75) Inventors: Toshitsugu Sakamoto, Tokyo (JP); Hisao Kawaura, Tokyo (JP); Hiroshi Sunamura, Tokyo (JP)

(73) Assignee: NEC Corporation, Tokyo (JP)

(21) Appl. No.: 12/169,902

(22) PCT Filed: Jul. 16, 2004

(86) PCT No.: PCT/JP2004/010206

§ 371 (c)(1),
(2), (4) Date: Apr. 13, 2005

(87) PCT Pub. No.: WO2005/008783

PCT Pub. Date: Jan. 27, 2005

Related U.S. Patent Documents

Reissue of:
(64) Patent No.: 7,116,573
Issued: Oct. 3, 2006
Appl. No.: 10/531,224
Filed: Apr. 13, 2005

(30) Foreign Application Priority Data

Jul. 18, 2003 (JP) ..... 2003-276660

(51) Int. Cl.
*G11C 11/00* (2006.01)

(52) U.S. Cl. ..... 365/153; 365/103; 365/177; 326/39; 438/408

(58) Field of Classification Search ..... 365/100, 365/103, 148, 153, 158, 177; 326/39; 438/408
See application file for complete search history.

(56) References Cited

U.S. PATENT DOCUMENTS 4,163,982 A 8/1979 Di Domenico, Jr. et al.
4,187,530 A 2/1980 Singh et al.

(Continued)

FOREIGN PATENT DOCUMENTS

JP H02-091133 7/1990
JP H08-078532 3/1996

(Continued)

OTHER PUBLICATIONS

T. Sakamoto, et al., "Nanometer–scale switches using copper sulfide"; Applied Physics Letters; vol. 82(18); May 5, 2003; pp. 3032–3034.

*Primary Examiner*—Hoai V Ho
(74) *Attorney, Agent, or Firm*—Dickstein Shapiro LLP

(57) ABSTRACT

A switching element has an ion conductor capable of conducting metal ions for use in an electrochemical reaction therein, a first electrode and a second electrode which are disposed in contact with said ion conductor and spaced a predetermined distance from each other, and a third electrode disposed in contact with the ion conductor. When a voltage for causing the switching element to transit to an on state is applied to the third electrode, metal is precipitated between the first electrode and the second electrode by metal ions, electrically interconnecting the first electrode and the second electrode. When a voltage for causing the switching element to transit to an off state is applied to the third electrode, the precipitated metal is dissolved to electrically disconnect the first electrode and the second electrode from each other.

17 Claims, 8 Drawing Sheets

U.S. PATENT DOCUMENTS

| | | | | |
|---|---|---|---|---|
| 4,203,158 | A | | 5/1980 | Frohman-Bentchkowsky et al. |
| 4,839,700 | A | | 6/1989 | Ramesham et al. |
| 4,945,257 | A | | 7/1990 | Marrocco, III |
| 5,070,384 | A | | 12/1991 | McCollum et al. |
| 5,387,812 | A | | 2/1995 | Forouhi et al. |
| 5,761,115 | A | * | 6/1998 | Kozicki et al. ..... 365/182 |
| 6,348,365 | B1 | | 2/2002 | Moore et al. |
| 6,381,381 | B1 | * | 4/2002 | Takeda et al. ..... 385/16 |
| 6,992,323 | B2 | * | 1/2006 | Krieger et al. ..... 257/40 |
| 7,750,332 | B2 | | 7/2010 | Sakamoto et al. |
| 2004/0089882 | A1 | | 5/2004 | Aono et al. |
| 2004/0124407 | A1 | * | 7/2004 | Kozicki et al. ..... 257/9 |

FOREIGN PATENT DOCUMENTS

| | | | |
|---|---|---|---|
| JP | H09-036355 | | 2/1997 |
| JP | 2000-223599 | | 8/2000 |
| JP | 2002-076325 | A | 3/2002 |
| JP | 2002-076325 | | 3/2002 |
| JP | 2002-141494 | A | 5/2002 |
| JP | 2003-092387 | | 3/2003 |
| WO | WO-2000/048196 | | 8/2000 |
| WO | WO-03/094227 | A1 | 11/2003 |

* cited by examiner

NEGATIVE ELECTLODE : $Cu^{2+} + 2e^- \rightarrow Cu$

POSITIVE ELECTLODE : $Cu \rightarrow Cu^{2+} + 2e^-$

SWITCHING ELEMENT METHOD OF DRIVING SWITCHING ELEMENT REWRITABLE LOGIC INTEGRATED CIRCUIT AND MEMORY

Matter enclosed in heavy brackets [ ] appears in the original patent but forms no part of this reissue specification; matter printed in italics indicates the additions made by reissue.

TECHNICAL FIELD

The present invention relates to a switching element utilizing an electrochemical reaction, a method of driving the switching element, an FPL (Field Programmable Logic: a rewritable logic integrated circuit) circuit and a memory element which employ the switching element.

BACKGROUND ART

Of memory integrated circuits, switching elements having a nonvolatile function capable of being kept on or off even when their power supply is switched off include an antifuse element as a first conventional example and an EEPROM (Electrical Erasable Programmable Read Only Memory) as a second conventional example.

Switching elements for performing a nonvolatile function based on an electrochemical reaction include a timer (or an electrochemical time switching device) as a third conventional example and a PCRAM (Programmable Conductor Random Access Memory) as a fourth conventional example.

The antifuse element as the first conventional example is a switching element having two states, i.e., electrically on and off states, and can irreversibly transit from the off state to the on state according to an electrical or physical process. The antifuse element as the first conventional example is disclosed in U.S. Pat. No. 5,070,384 and U.S. Pat. No. 5,387,812. The antifuse element is usually formed between two interconnects. When a -high voltage is selectively applied between the interconnects, the antifuse element is programmed (transiting from the off state to the on state), electrically interconnecting the interconnects. Even after the voltage is turned off, the antifuse element remains in the on state.

The EEPROM as the second conventional example as disclosed in U.S. Pat. No. 4,203,158 has a floating gate electrode disposed between the control gate electrode and channel layer of a transistor. When the floating gate electrode stores electric charges, i.e., when it is charged, or when the flouting gate electrode discharges electric charges, i.e., when it is discharged, the threshold voltage of the transistor changes. The floating gate electrode is charged or discharged by injecting electrons into the floating gate electrode or discharging electrons from the floating gate electrode in the form of a tunnel current flowing through an oxide film. Since the floating gate electrode is surrounded by an insulating film, the electric charges stored therein are not lost after the EEPROM is switched off. Therefore, the EEPROM has a nonvolatile capability.

In recent years, antifuse elements and EEPROMs are used in FPL circuits which are integrated circuits whose hardware configuration can be changed for each application. One example of an FPL circuit is disclosed in Japanese laid-open patent publication No. 8-78532. The disclosed FPL circuit has a plurality of logic circuit blocks, interconnects interconnecting the logic circuit blocks, and antifuse elements for changing the connection of the interconnects. The antifuse elements are used as programming elements. The antifuse elements selected by the user connect interconnects. Therefore, the FPL circuit provides a different hardware configuration for a selection of antifuse elements to connect interconnects. FPL circuits offer many advantages in that they are more versatile than ASICs (Application Specific Integrated Circuits) and can be manufactured inexpensively in a short turnaround time, and are finding a rapidly growing market.

The timer as the third conventional example has a closed loop made up of a DC power supply, a load, and first and second inner electrodes. Part of the first and second inner electrodes is immersed in an electrolytic solution and electroplated, and one of the first and second inner electrodes is cut off, selling a time for the timer. The timer as the third conventional example is disclosed in Japanese laid-open utility model publication No. 2-91133.

The electronic element as the fourth conventional example, as disclosed in U.S. Pat. No. 6,348,365, is a PCRAM utilizing silver germanide/selenide which is a silver ion conductive ion conductive material (the term "ion conductive material" has the same meaning as "ion conductor" used in the present specification) as a material for conducting ions.

FIG. 1 of the accompanying drawings is a schematic cross-sectional view showing a structure of the PCRAM disclosed in U.S. Pat. No. 6,348,365. As shown in FIG. 1, insulating material 81, conductive material 82, and dielectric material 83 are successively disposed on semiconductor substrate 87, and dielectric material 83 partly has a recessed structure (grooved structure). Ion conductive, material 86 and metal material 84 are disposed in the recessed structure, and electrode 85 is disposed on metal material 84 and dielectric material 83. When a voltage is applied between electrode 85 and conductive material 82, a current path referred to as a dendrite grows on the surface of ion conductive material 86, thus electrically connecting electrode 85 and conductive material 82 to each other. When a reverse voltage is applied, the dendrite disappears, electrically isolating electrode 85 and conductive material 82 from each other.

The antifuse element as the first conventional example is a switching element used mainly in FPL circuits. Since the on-resistance, which is the resistance of the antifuse element when it is in the on state, is small (about 50Ω), the antifuse element has a small signal delay time. However, the antifuse element is problematic in that it is not reprogrammable. Consequently, when the FPL circuit is programmed, it fails to meet demands for debugging the program and changing programs while it is in operation.

While the EEPROM as the second conventional example is reprogrammable, the level of integration thereof is low at present and the on-resistance thereof is of a large value of several kΩ because it is limited by the resistance of the MOS (Metal Oxide Semiconductor) transistor. Though the EEPROM is widely used as nonvolatile memory, the level of integration thereof is limited by the thickness of the insulating film, making it difficult to further integrate the EEPROM. In addition, when the EEPROM is used in an FPL circuit, it tends to cause a signal delay due to the large on-resistance.

The timer as the third conventional example is a device for measuring time until the electrode is dissolved by an electroplating process which is based on an electrochemical reaction. The timer cannot operate as a switching element for switching between on and off states.

The electronic element as the fourth conventional example is basically a two-terminal switch utilizing an electrochemical reaction. The transition of the two-terminal switch between on and off states is controlled by a voltage that is applied between the two terminals of the switch. When the transition occurs between the on and off states, a current flows through the switch, and the switch consumes a large amount of electric power. The switch requires thick interconnects that can withstand the current that is needed to cause the transition between the on and off states, and also requires a transistor having large drive power. Even though the switch itself can be integrated, it is difficult to integrate the interconnects and peripheral circuits.

DISCLOSURE OF THE INVENTION

It is an object of the present invention to provide a switching element which can be highly integrated, can be kept in either one of an on state and an off state even when the switching element is switched off, has a low resistance when it is in the on state, and can be reprogrammed into either one of the on and off states, a method of driving the switching element, and an FPL circuit and a memory element which employ the switching element.

A switching element according to the present invention has an ion conductor capable of conducting metal ions therein, a first electrode and a second electrode which are disposed in contact with the ion conductor, and a third electrode disposed in contact with the ion conductor and including the metal ions, wherein an interelectrode distance L1 between the first electrode and the second electrode, an interelectrode distance L2 between the first electrode and the third electrode, and an interelectrode distance L3 between the second electrode and the third electrode satisfy the condition according to the expression:

$$L1<L2\times 2 \text{ and } L1<L3\times 2.$$

According to the present invention, metal can be precipitated between the first electrode and the second electrode, and the precipitated metal can be dissolved by controlling a voltage applied to the third electrode. The switching element can switch between a state in which the first electrode and the second electrode are electrically interconnected and a state in which the first electrode and the second electrode are not electrically interconnected.

In the switching element according to the present invention, the interelectrode distance between the first electrode and the second electrode may be 0.5 μm or less. If the interelectrode distance between the first electrode and the second electrode is 0.5 μm or less, then the switching element according to the present invention can be incorporated into various integrated circuits.

The switching element according to the present invention may be disposed on a substrate covered with an insulating film or an insulating substrate. According to on aspect of this arrangement, the first electrode and the second electrode may be disposed on the substrate so that they are separated from each other, and the interelectrode distance between the first electrode and the second electrode may be 0.5 μm or less, the ion conductor may be disposed to cover the first electrode and the second electrode, and the third electrode may be disposed on the ion conductor. According to another aspect, the third electrode may be disposed on the substrate, the ion conductor may be disposed on the third electrode, the first electrode and the second electrode may be disposed on the ion conductor in spaced-apart relation to each other, and the interelectrode distance between the first electrode and the second electrode may be 0.5 μm or less. According to still another aspect, the first electrode may be disposed on the substrate, the ion conductor may be disposed on the first electrode, the second electrode and the third electrode may be disposed on the ion conductor, and the interelectrode distance between the first electrode and the second electrode may be equal to or greater than the film thickness of the ion conductor. With either one of these aspects, an integrated circuit combined with a semiconductor element can be easily formed.

In the switching element according to the present invention, an electrical characteristic between the first electrode and the second electrode may be controlled by applying a voltage to the third electrode. The electrical characteristic may represent electric conductivity.

In the switching element according to the present invention, the first electrode and the second electrode may be electrically interconnected to bring the switching element into an on state by applying a voltage, which is positive with respect to at least one of the first electrode and the second electrode, to the third electrode, and the first electrode and the second electrode may be insulated from each other to bring the switching element into an off state by applying a voltage, which is negative with respect to at least one of the first electrode and the second electrode, to the third electrode.

In the switching element according to the present invention, the second electrode may include a metal dissolvable into the ion conductor based on an electrochemical reaction. In this case, the first electrode and the second electrode may be electrically interconnected to bring the switching element into an on state by either applying a voltage, which is positive with respect to the first electrode, to the second electrode, or applying a voltage, which is positive with respect to at least one of the first electrode and the second electrode, to the third electrode, and the first electrode and the second electrode may be insulated from each other to bring the switching element into an off state by either applying a voltage, which is negative with respect to the first electrode, to the second electrode, or applying a voltage, which is negative with respect to at least one of the first electrode and the second electrode, to the third electrode.

In the switching element according to the present invention, at least one of the first electrode, the second electrode, and the third electrode may have a pointed portion on a surface thereof held in contact with the ion conductor.

In the switching element according to the present invention, the ion conductor may comprise either a calcogenide material including an element belonging to the group 6B of the periodic table, metal ionic glass, or metal ionic amorphous semiconductor.

In the switching element according to the present invention, the ion conductor and the third electrode may be made of either copper sulfide and copper, respectively, or silver sulfide and silver, respectively, and portions of the first electrode and the second electrode which are held in contact with the ion conductor may be made of either a metal such as platinum, aluminum, gold, titanium, tungsten, vanadium, niobium, tantalum, chromium, or molybdenum, a nitride of the metal, a silicide of the metal, or a combination thereof.

A method of driving a switching element according to the present invention has the step of controlling the electrical characteristic based on the voltage applied to the third electrode and/or a time in which the voltage is applied to the third electrode.

A method of driving a switching element according to the present invention has the steps of selectively bringing the switching element into the on state and the off state depending on the polarity of the voltage applied to the third electrode, and holding the switching element in either the on state or the off state by slopping application of the voltage to the third electrode. When the switching element is caused to transit between the on state and the off state, the conductivity between the first electrode and the second electrode may be measured, and the voltage applied to the third electrode may be controlled based on a change in the conductivity.

A rewritable logic integrated circuit according to the present invention incorporates a switching element according to the present invention as a programming switch.

A memory device according to the present invention has memory cells each comprising a switching element according to the present invention and either a MOS transistor or a diode. The memory cell may comprise a MOS transistor, the switching element may have the second electrode connected to the drain electrode of the MOS transistor, the first electrode to a first bit line, and the third electrode to a first word line, and the MOS transistor may have a source electrode connected to a second bit line different from the first bit line and a gate electrode connected to a second word line different from the first word line.

A switching element according to the present invention is a switching element utilizing an electrochemical reaction, and has an ion conductor capable of conducting metal ions for use in an electrochemical reaction therein, a first electrode and a second electrode which are disposed in contact with the ion conductor and spaced a predetermined distance from each other, and a third electrode disposed in contact with the ion conductor, for precipitating a metal between the first electrode and the second electrode due to metal ions when a voltage for causing the switching element to transit to an on state is applied to the third electrode, and dissolving the precipitated metal to electrically disconnect the first electrode and the second electrode from each other when a voltage for causing the switching element to transit to an off state is applied to the third electrode.

According to the present invention, when the voltage for causing the switching element to transit to the on state is applied to the third electrode, metal ions in the ion conductor are attracted to the first electrode and the second electrode by an electrochemical reaction, precipitating metal on the surfaces of these electrodes to electrically interconnect the first electrode and the second electrode with the metal precipitated between these electrodes. When the voltage for causing the switching element to transit to the off state is applied to the third electrode, the metal precipitated between the first electrode and the second electrode is dissolved as metal ions into the ion conductor, electrically disconnecting the first electrode and the second electrode from each other. In the on state, since the first electrode and the second electrode are interconnected by the metal, the resistance between the first electrode and the second electrode is made smaller.

In the switching element according to the present invention, when the application of the voltage to the third electrode is stopped after the switching element has been brought into the on state or the off state, the switching element is held in that state.

According to the present invention, even when no voltage is applied to the third electrode after the switching element has been brought into the on state, the first electrode and the second electrode remain electrically interconnected by the precipitated metal. Even when no voltage is applied to the third electrode after the switching element has been brought into the off state, the first electrode and the second electrode remain electrically disconnected from each other. Therefore, the switching element is rendered nonvolatile, holding information in the on state or the off state.

A switching element according to the present invention is a switching element utilizing an electrochemical reaction, and has an ion conductor capable of conducting metal ions for use in an electrochemical reaction therein, a first electrode disposed in contact with the ion conductor, a second electrode disposed in contact with the ion conductor and spaced a predetermined distance from the first electrode, for precipitating a metal due to metal ions to electrically connect the second electrode to the first electrode when a voltage for causing the switching element to transit to an on state is applied to the second electrode, and dissolving the precipitated metal to electrically disconnect the second electrode from the first electrode when a voltage for causing the switching element to transit to an off state is applied to the second electrode, and a third electrode disposed in contact with the ion conductor for increasing a current flowing between the first electrode and the creasing a current flowing between the first electrode and the second electrode when a voltage, which is positive with respect to the first electrode, is applied to the third electrode, and reducing the current when a voltage, which is negative with respect to the first electrode, is applied to the third electrode.

According to the present invention, when the voltage for causing the switching element to transit to the on state is applied to the second electrode, metal ions in the ion conductor are attracted to the first electrode by an electrochemical reaction, precipitating a metal on the surface of the first electrode to electrically interconnect the first electrode and the second electrode with the metal precipitated between these electrodes. When a voltage, which is positive with respect to the first electrode, is applied to the third electrode, tie amount of metal precipitated between the first electrode and the second electrode increases, increasing the current flowing therebetween. When a voltage, which is negative with respect to the first electrode, is applied to the third electrode after the switching element has been brought into the on state, the amount of metal precipitated between the first electrode and the second electrode decreases, reducing the current flowing therebetween. When the voltage for causing the switching element to transit to the off state is applied to the second electrode, the metal precipitated between the first electrode and the second electrode is dissolved as metal ions into the ion conductor, electrically disconnecting the first electrode and the second electrode from each other. Therefore, the on state and the off state can be controlled by applying the voltage to the second electrode, and the magnitude of the current can be controlled by applying the voltage to the third electrode.

A switching element according to the present invention is a switching element utilizing an electrochemical reaction, and has an ion conductor capable of conducting metal ions for use in an electrochemical reaction therein, a first electrode disposed in contact with the ion conductor, a second electrode disposed in contact with the ion conductor and spaced a predetermined distance from the first electrode, for precipitating a metal due to metal ions when a predetermined voltage is applied to the second electrode for a predetermined time, and a third electrode disposed in contact with the ion conductor for precipitating a metal due to metal ions to electrically interconnect the first electrode and the second electrode when a voltage for causing the switching element to transit to an on state is applied to the third electrode after the predetermined voltage has been applied to the second electrode for the predetermined time.

According to the present invention, when the voltage for causing the switching element to transit to the on state is applied to the third electrode after the voltage has been applied to the second electrode before the first electrode and the second electrode are interconnected by the metal precipitated by on electrochemical reaction, the first electrode and the second electrode are electrically connected to each other. Therefore, when the first electrode and the second electrode are electrically connected to each other, an excessive current is prevented from flowing, and the electric power consumed by the switching element is reduced.

In the switching element according to the present invention, the third electrode may include a material for supplying metal ions to the ion conductor, and portions of the first electrode and the second electrode which are held in contact with the ion conductor may be made of a material which does not react with the ion conductor.

According to the present invention, since metal ions are supplied from the third electrode to the ion conductor by an electrochemical reaction, the ion conductivity is increased, increasing the speed at which the switching element transits between the on state and the off state.

In the switching element according to the present invention, the third electrode and the second electrode may include a material for supplying metal ions to the ion conductor, and a portion of the first electrode which is held in contact with the ion conductor may be made of a material which does not react with the ion conductor.

According to the present invention, since metal ions are supplied from the third electrode and the second electrode to the ion conductor by an electrochemical reaction, the ion conductivity is increased, increasing the speed at which the switching element transits between the on state and the off state.

In the switching element according to the present invention, the first electrode and the second electrode may be formed in one plane parallel to a planar pattern of the third electrode, at least one of the first electrode and the second electrode may have a planar pattern having a pointed portion, and the shortest distance between the first electrode and the second electrode may be represented by the distance from the pointed portion of one of the electrodes to the other electrode.

According to the present invention, since the shortest distance between the electrodes is equal to the distance from the pointed portion of one of the electrodes to the other electrode, the electrode with the pointed portion can be electrically connected to the other electrode when copper is precipitated at least in the vicinity of the pointed portion. Therefore, excessive copper does not need to be precipitated, allowing the switching element to transit from the off state to the on state at an increased speed. The switching element is also allowed to transit from the on state to the off state at an increased speed because the metal in the vicinity of the pointed portion may be dissolved for bringing the switching element into the off state.

The rewritable logic integrated circuit according to the present invention which will achieve the above object incorporates either one of the above switching elements according to the present invention as a programming switch. According to the present invention, a logic circuit can be freely established by causing the switching element used as the programming element to be in the on state or the off state.

The memory device according to the present invention which will achieve the above object has either one of the above switching elements according to the present invention and a transistor for reading information indicative of whether the switching element is in the on state or the off state. According to the present invention, after the switching element has been brought into the on state or the off state based on an electrochemical reaction, the switching element is held in that state even if no voltage is applied to the third electrode and the second electrode. The memory device can thus be used as a nonvolatile memory.

According to the present invention, therefore, there is provided a switching element which can be set to the on state or the off state desirably by applying a predetermined voltage to at least one of the third electrode and the second electrode, and which is nonvolatile and has smaller resistance when it is in the on state. Furthermore, inasmuch as the switching element according to the present invention is of a simple and minute structure, it can be manufactured in a much smaller design than heretofore.

If the switching element according to the present invention is incorporated in an FPL circuit, then the FPL circuit is reprogrammable and can operate at a high speed.

If the switching element according to the present invention is used as an information storage means in a memory device, then the memory device is available as nonvolatile memory having high writing and reading rates. Inasmuch as the switching element according to the present invention is of a simple and minute structure, the memory device can be manufactured as a highly integrated, high-speed memory device.

With a manufacturing process according to the present invention, the switching element can be consistently and accurately manufactured, using the conventional technology for manufacturing semiconductor integrated circuits. Therefore, the switching element, and the FPL circuit and the memory device incorporating the switching element can be produced at a low cost.

BEST MODE FOR CARRYING OUT THE INVENTION

A switching element according to the present invention is characterized as follows: A voltage applied to a third electrode is controlled to precipitate a metal between a first electrode and a second electrode to electrically interconnect the first electrode and the second electrode, i.e., to achieve an on state. The metal precipitated between the first electrode and the second electrode is dissolved to disconnect the first electrode and the second electrode, i.e., to achieve an off state. Each of these states is kept even if the voltage is no longer applied to the third electrode.

Arrangements of the present invention will be described below.

In the following description and FIGS. 2, 3A, 3B, 5, 6A, 6B, 8A, 8B, 8C, 9, 10, 11, and 12, the first electrode corresponds to a source electrode, the second electrode to a drain electrode, and the third electrode to a gate electrode.

Figure 1:
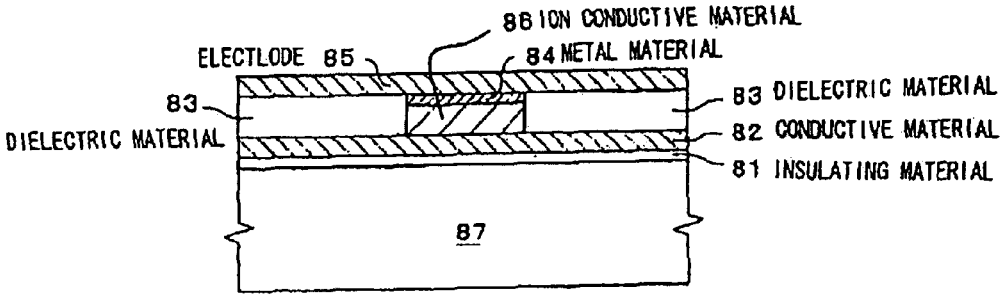
FIG. 1 is a schematic cross-sectional view of an electronic element as a fourth conventional example.
Figure 2:
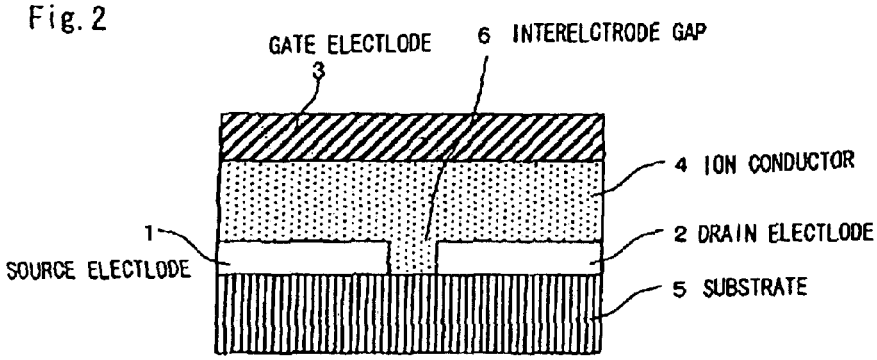
FIG. 2 is a cross-sectional view showing the structure of a switching element according to the present invention.

FIG. 2 is a cross-sectional view showing a structure of a switching element according to the present invention.

As shown in FIG. 2, the switching element according to the present invention has source electrode 1 and drain electrode 2 disposed on substrate 5 comprising a silicon substrate covered with a silicon oxide film as an insulating film and spaced a predetermined distance from each other, ion conductor 4 disposed in contact with source electrode 1 and drain electrode 2 and including metal ions for an electrochemical reaction, and gate electrode 3 disposed on ion conductor 4. Gate electrode 3 serves to control conductivity between source electrode 1 and drain electrode 2 depending on the magnitude of the voltage applied to gate electrode 3. Source electrode 1, drain electrode 2, and gate electrode 3 are electrically insulated from each other.

Gate electrode 3 includes a material for supplying metal ions to ion conductor 4 bused on an electrochemical reaction. The portions of source electrode 1 and drain electrode 2 which are held in contact with ion conductor 4 are made of a material which does not electrochemically react with ion conductor 4. Therefore, source electrode 1 and drain electrode 2 do not supply metal ions to ion conductor 4.

Operation of the switching element thus constructed will be described below.

When a voltage, which is positive with respect to source electrode 1 and drain electrode 2, is applied to gate electrode 3, a metal is precipitated on source electrode 1 and drain electrode 2, which are positioned closely to each other, due to a reduction reaction of metal ions. The metal that is precipitated in an interelectrode gap 6, across which source electrode 1 and drain electrode 2 are spaced from each other by the predetermined distance, electrically interconnects source electrode 1 and drain electrode 2, whereupon the switching element transits to an on state. When a voltage, which is negative with respect to source electrode 1 and drain electrode 2, is applied to gate electrode 3, the metal precipitated in interelectrode gap 6 is oxidized into metal ions, which are dissolved into ion conductor 4. The metal is now removed from interelectrode gap 6, causing the switching element to transit to an off state. Interelectrode gap 6 represents the shortest distance between source electrode 1 and drain electrode 2.

The on and off states of the switching element are kept even if the voltages are no longer applied to gate electrode 3. After the on state is reached, the metal is precipitated or dissolved depending on the time for which the voltage is applied to gate electrode 3 and the applied voltage, allowing the voltage applied to gate electrode 3 to control the conductivity between source electrode 1 and drain electrode 2.

If the interelectrode distance between source electrode 1 and drain electrode 2 is represented by L1, the interelectrode distance between source electrode 1 and gate electrode 3 by L2, and the interelectrode distance between drain electrode 2 and gate electrode 3 by L3, then source electrode 1 drain electrode 2, and gate electrode 3 can be positioned to satisfy the condition according to the following expression (1):

$$L1<L2\times 2 \text{ and } L1<L3\times 2 \quad (1)$$

With the switching element constructed to satisfy the condition according to the expression (1), when a metal is grown from both source electrode 1 and drain electrode 2, source electrode and gate electrode or drain electrode and gate electrode are essentially prevented from being electrically interconnected before source electrode and drain electrode are electrically interconnected by the grown metal.

Source electrode 1, drain electrode 2, and gate electrode 3 may be positioned to satisfy the condition according to the following expression (2):

$$L1<L2\times 1 \text{ and } L<L3\times 1 \quad (2)$$

With the switching element constructed to satisfy the condition according to the expression (2), when a metal is grown from either one of source electrode and drain electrode, source electrode and gate electrode or drain electrode and gate electrode are essentially prevented from being electrically interconnected before source electrode and drain electrode are electrically interconnected by the grown metal. If the electrical conductivity between source electrode 1 and drain electrode 2 is to be controlled by the voltage applied to gate electrode 3, the arrangement which meets the condition according to the expression (2) makes it possible to increase a variable margin of the voltage applied to gate electrode 3.

Furthermore, source electrode 1, drain electrode 2, and gate electrode 3 may be positioned to satisfy the condition according to the following expression (3):

$$L1<L2\times \tfrac{1}{2} \text{ and } L1<L3\times \tfrac{1}{2} \quad (3)$$

With the switching element constructed to satisfy the condition according to the expression (3), source electrode and gate electrode or drain electrode and gate electrode are reliably prevented from being electrically interconnected by metal grown from source electrode and/or drain electrode.

The smaller the interelectrode distance L1 between source electrode 1 and drain electrode 2, the lower the voltage applied to gate electrode 3, allowing the switching element to consume smaller electric power and also allowing the switching element to switch between the on state and the off state faster. If the interelectrode distance L1 is 0.5 μm or smaller, then the switching element according to the present invention can be incorporated into various integrated circuits. However, if the interelectrode distance L1 is too small, leakage current flowing when a voltage is applied between source electrode and drain electrode increases. The interelectrode distance L1 may be set such that the leakage current will be 1/10 or less of the current flowing between source electrode and drain electrode.

Electrical characteristics of the switching element shown in FIG. 2 will be described below.

Figure 3A:
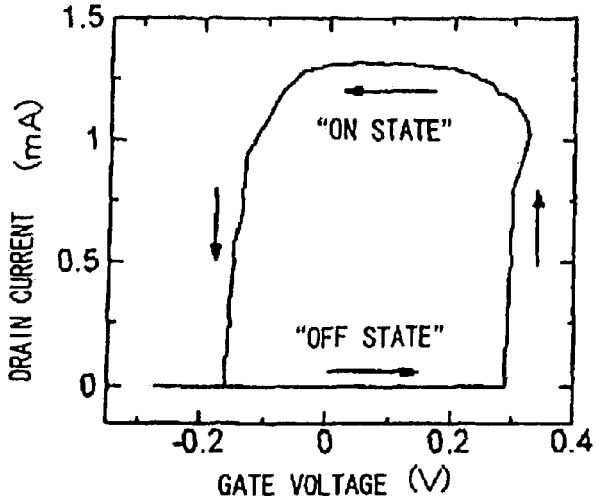
FIG. 3A is a graph showing electrical characteristics of the switching element according to the present invention.
Figure 3B:
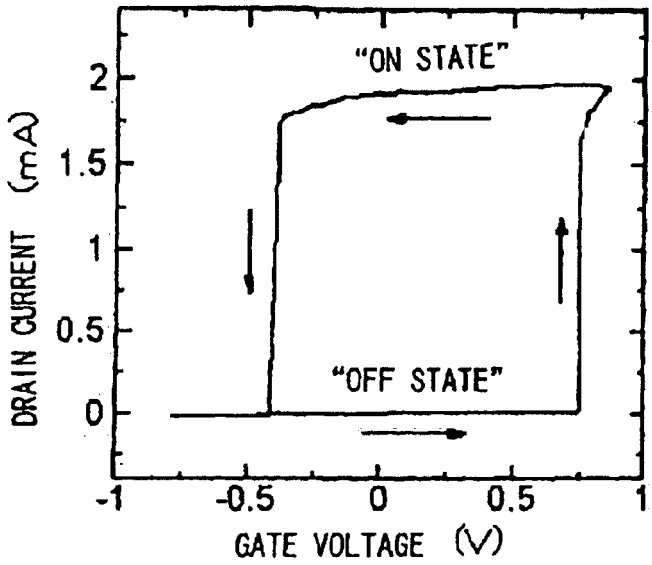
FIG. 3B is a graph showing electrical characteristics of the switching element according to the present invention.

FIGS. 3A and 3B are graphs showing electrical characteristics of the switching element. In FIGS. 3A and 3B, the horizontal axis represents the gate voltage which is the voltage applied to gate electrode 3 of the switching element shown in FIG. 2, and the vertical axis the drain current which is current flowing between source electrode 1 and drain electrode 2.

In the switching element used to make the measurement shown in FIG. 3A, ion conductor 4 comprises an aqueous solution of copper sulfide, source electrode 1 and drain electrode 2 are made of platinum (Pt) which is not dissolvable into ion conductor 4, and gate electrode 3 is made of copper (Cu) which is capable of electrochemically reacting with ion conductor 4.

As shown in FIG. 3A, when a constant voltage is applied between drain electrode 2 and source electrode 1 and a potential difference between gate electrode 3 and source electrode 1 is repeatedly varied, the conductivity between drain electrode 2 and source electrode 1 exhibits hysteresis. The hysteretic conductivity will be described in detail below.

In an initial state with no voltage applied, the switching element is in the off state and almost no drain current flows. When the gate voltage applied to gate electrode 3 is changed positively from 0 V to +0.3 V in the off state, a drain current of about 1.2 mA flows, causing the switching element to transit to the on state. When the gate voltage is changed negatively to −0.16 V in the on state, almost no drain current flows, causing the switching element to transit to the off state. Thus, when the gate voltage is in the range from −0.16 V to +0.3 V, no switch transition occurs, and the switching element is stably held in the on state or the off state. It is possible to cause the switching element to transit between the on state and the off state as many times as desired by repeatedly varying the gate electrode.

The reasons why the switching element transits between the on state and the off state as shown in FIG. 3A will be described below.

Figure 4:
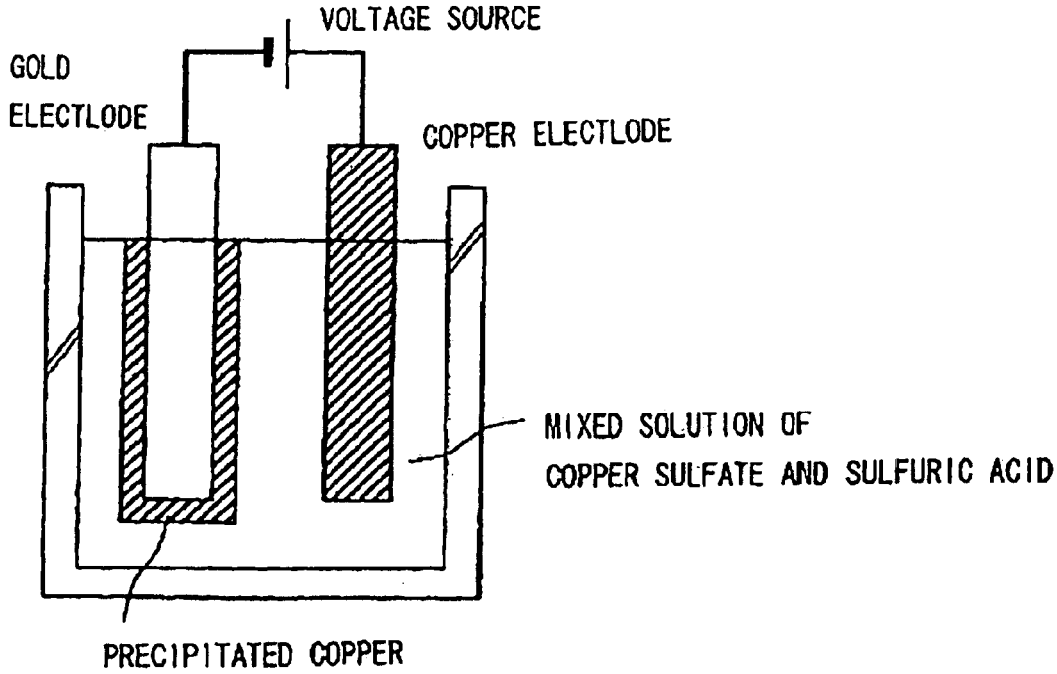
FIG. 4 is a view illustrative of an electrochemical reaction of the switching element according to the present invention.

FIG. 4 is a view illustrative of the precipitation and dissolution of copper due to an electrochemical reaction.

As shown in FIG. 4, a gold electrode and a copper electrode are immersed in an ion conductor in the form of a mixed solution of copper sulfate and sulfuric acid, and a voltage is applied from a voltage source to the copper electrode as a positive electrode and the gold electrode as a negative electrode. Since the mixed solution is a copper plating solution, copper of the copper electrode is dissolved as copper ions into the ion conductor, and copper is precipitated on the gold electrode. Copper is thus precipitated and dissolved by such an electrochemical reaction.

The switching element according to the present invention utilizes the electrochemical reaction shown in FIG. 4. The copper electrode shown in FIG. 4 corresponds to gate electrode 3 shown in FIG. 2, and the gold electrode shown in FIG. 4 corresponds to source electrode 1 and drain electrode 2 shown in FIG. 2.

The electrochemical reaction shown in FIG. 4 will be described with respect to the switching element shown in FIG. 2.

When copper is precipitated on the surfaces of source electrode 1 and drain electrode 2 by the above electrochemical reaction, interelectrode gap 6 is filled with copper, electrically interconnecting source electrode 1 and drain electrode 2 to cause the switching element to transit to the on state. After the switching element has transited to the on state shown in FIG. 3A, when the applied gate voltage is made greater than +0.3 V, the drain current increases with the gate electrode. This means that conductivity between source electrode 1 and drain electrode 2 increases as the precipitated amount of copper increases.

When the copper precipitated in interelectrode gap 6 is dissolved into ion conductor 4 by the electrochemical reaction, the copper is removed from interelectrode gap 6, electrically disconnecting source electrode 1 and drain electrode 2, causing the switching element to transit to the off state.

The speed of transition between the on state and the off state will be described below.

When copper ions dissolved from gate electrode 3 travel to the surface of source electrode 1 or drain electrode 2 and are coupled to electrons, copper is precipitated, electrically interconnecting source electrode 1 and drain electrode 2. When the copper that fills interelectrode gap 6 between source electrode 1 and drain electrode 2 is dissolved, source electrode 1 and drain electrode 2 are electrically disconnected from each other. The speed of transition between the on state and the off state is thus determined by the speed at which the metal ions travel in ion conductor 4 and the rate of the electrochemical reaction. The speed at which the metal ions travel in ion conductor 4 depends upon the ion conductivity and the gate voltage.

The switching element which exhibits the electrical characteristics shown in FIG. 3B will be described below.

In the switching element used to make the measurement shown in FIG. 3B, ion conductor 4 comprises an aqueous solution of copper sulfide, source electrode 1 is made of platinum (Pt), and gate electrode 3 and drain electrode 2 are made of copper (Cu) which is capable of electrochemically reacting with ion conductor 4.

As shown in FIG. 3B, when a constant voltage is applied between drain electrode 2 and source electrode 1 and a potential difference between gate electrode 3 and source electrode 1 is repeatedly varied, the conductivity between drain electrode 2 and source electrode 1 exhibits hysteresis.

The hysteretic conductivity will be described in detail below. In an initial state with no voltage applied, the switching element is in the off state and almost no drain current flows. When the gate voltage applied to gate electrode 3 is changed positively from 0 V to +0.75 V in the off state, a drain current of about 2 mA flows, causing the switching element to transit to the on state. When the gate voltage is changed negatively to −0.4 V in the on state, almost no drain current flows, causing the switching element to transit to the off state. Thus, when the gate voltage is in the range from −0.4 V to +0.75 V, no switch transition occurs, and the switching element is stably held in the on state or the off state. It is possible to cause the switching element to transit between the on state and the off state as many times as desired by repeatedly varying the gate electrode.

In the arrangements of the switching element used to make the measurements shown in FIGS. 3A and 3B, since drain electrode is made of copper which is capable of electrochemically reacting with ion conductor 4, the switching element may be caused to transit to the on state or the off state by applying a voltage between drain electrode and source electrode.

In the above example, ion conductor 4 comprises an electrolytic solution in the form of a mixed aqueous solution of copper sulfate and sulfuric acid. However, ion conductor 4 in other forms also produces the same effect as described above. Ion conductors are roughly classified into two types, i.e., a liquid and a solid. The liquid ion conductor is an electrolytic solution described above, and the solid ion conductor is a solid electrolyte wherein metal ions can freely move as in a solution. If the switching element is incorporated into an integrated circuit, then the solid ion conductor is suitable for use in the switching element. Silver ions and copper ions, in particular, exhibit ion conductivity in an appropriate solid electrolyte, e.g., silver sulfide or copper sulfide. The inventors have found that like copper ions in a mixed aqueous solution of copper sulfate and sulfuric acid, silver ions in silver sulfide and copper ions in copper sulfide exhibit a switching phenomenon based on transition between the on state and the off state. Known materials in which silver ions and copper ions travel include metal ionic glass and metal ionic amorphous semiconductor, other than calcogenides including elements which belong to group 6B of the periodic table.

Elements based on the above principles of operation have not heretofore been known in the art, and the inventors have devised and verified for the first time the mechanism of such elements.

1st Embodiment

Of switching elements according to the present invention, a switching element employing a solid electrolyte as an ion conductor will be described below.

Figure 5:
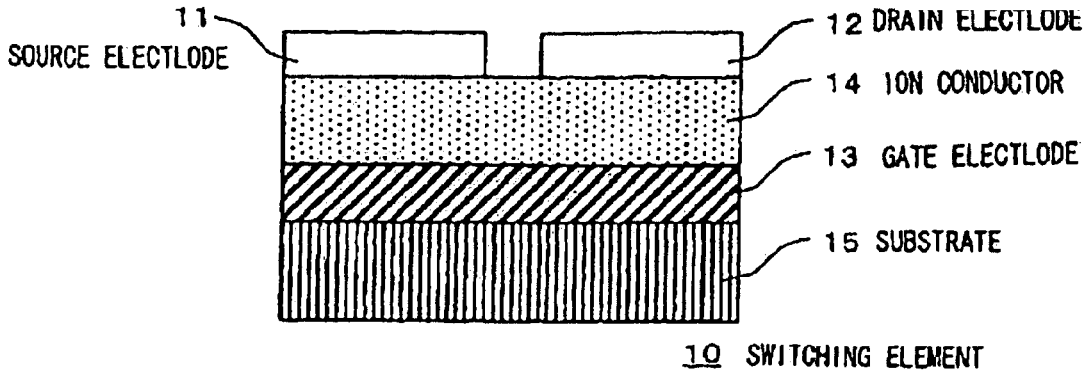
FIG. 5 is a cross-sectional view of a structure of a switching element according to the present invention.

FIG. 5 is a cross-sectional view of the structure of a switching element according to the present invention. As shown in FIG. 5, switching element 10 has gate electrode 13 disposed on substrate 15 covered with a silicon oxide film as an insulating film, ion conductor 14 disposed on gate electrode 13, and source electrode 11 and drain electrode 12 disposed on ion conductor 14. Source electrode 11 and drain electrode 12 are disposed within one plane, with a gap of 100 nm or less defined therebetween. Source electrode 11, drain electrode 12, and gate electrode 13 are electrically insulated from each other.

Gate electrode 13 includes a material for supplying metal ions to ion conductor 14 based on an electrochemical reaction. Ion conductor 14 should preferably comprise a solid electrolyte with as small electron conductivity as possible because the greater the electron conductivity, the greater the leakage current flowing when switching element 10 is in the off state. The portions of source electrode 11 and drain electrode 12 which are held in contact with ion conductor 14 are made of a material which does not electrochemically react with ion conductor 14. Therefore, source electrode 11 and drain electrode 12 do not supply metal ions to ion conductor 14 though they are held in contact with ion conductor 14.

Materials which do not react with ion conductor 14 include metals such as platinum, aluminum, gold, titanium, tungsten, vanadium, niobium, tantalum, chromium, molybdenum, etc. Materials which are hardly chemically reactive and ionizable may be nitrides of the above metals or silicon compounds (silicides) such as suicides of the above metals. The portions of source electrode 11 and drain electrode 12 which are held in contact with ion conductor 14 are not required to be made of a common material, but may each be made of either one of the above metals and compounds.

Planar patterns of source electrode 11 and drain electrode 12 will be described below.

Figure 6A:
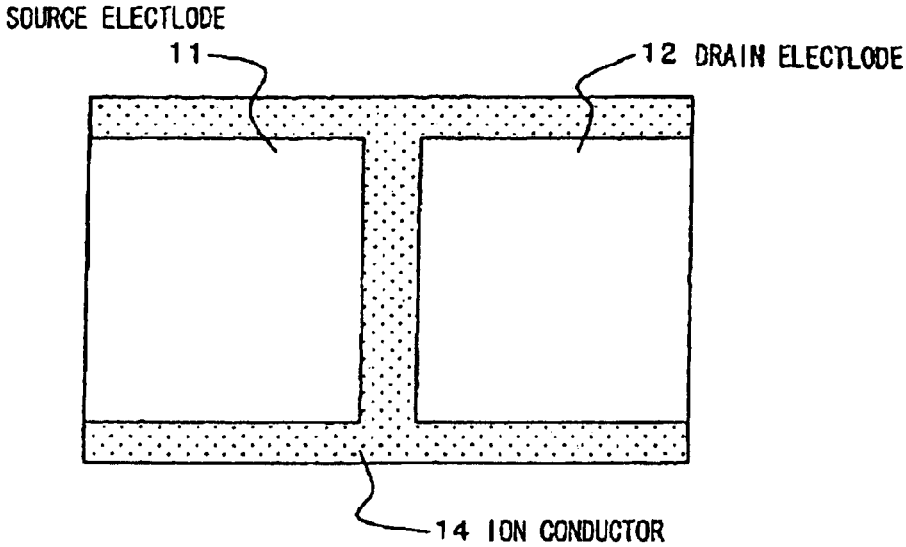
FIG. 6A is a plan view showing an example of a planar pattern of a source electrode and a drain electrode.
Figure 6B:
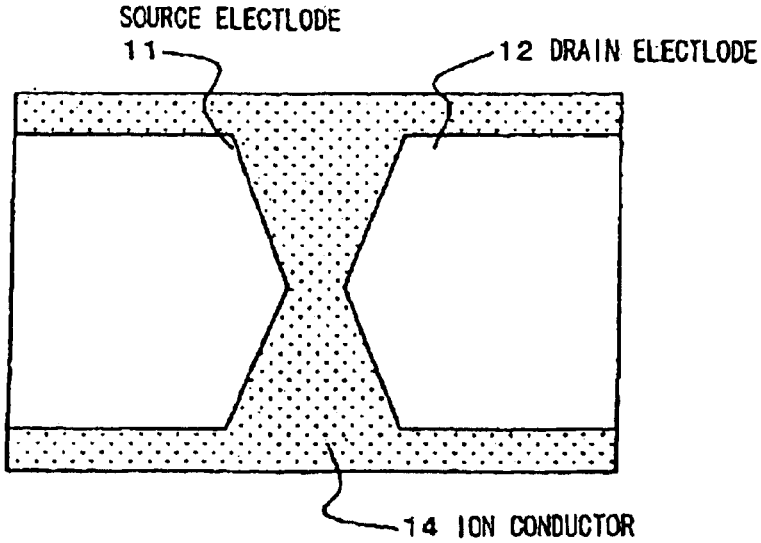
FIG. 6B is a plan view showing another example of a planar pattern of a source electrode and a drain electrode.

FIGS. 6A and 6B are plan views showing examples of planar patterns of source electrode 11 and drain electrode 12.

In FIG. 6A, planar patterns of source electrode 11 and drain electrode 12 are rectangular in shape, and the gap between these two electrodes is defined between two parallel sides thereof.

In FIG. 6B, planar patterns of source electrode 11 and drain electrode 12 are polygonal in shape, and the gap between these two electrodes, which represents the shortest distance therebetween, is defined between respective vertexes of the patterns. In this case, since source electrode 11 and drain electrode 12 are electrically interconnected by copper precipitated between the vortexes of the patterns, copper does not need to be precipitated excessively, and the switching element is allowed to transit to the on state faster than with the planar patterns of source electrode 11 and drain electrode 12 shown in FIG. 6A. When the precipitated copper is dissolved to electrically disconnect source electrode 11 and drain electrode 12, the switching element also transits to the off state faster. Though the gap between source electrode 11 and drain electrode 12 is illustrated as being defined between the vertexes of their patterns in FIG. 6B, one of the vertexes may be replaced with one side of the pattern. Such a modification is still considered to allow the switching element to transit to the on and off states faster than with the planar patterns shown in FIG. 6A. The two electrodes are not required to be polygonal in shape, but either one of the electrodes may have a pointed portion like the above vertex.

Operation of the switching element having the above structure will be described below.

Source electrode 11 is grounded, a voltage of +0.1 V is applied to drain electrode 12, and a positive voltage is applied to gate electrode 13. A drain current flowing between source electrode 11 and drain electrode 12 is observed, causing the switching element to transit to the on state. After the switching element has transited to the on state, when the gate voltage applied to gate electrode 13 is increased, the drain current is increased. When a negative voltage is applied to gate electrode 13, the drain current is reduced, causing the switching element to transit to the off state.

Figure 7:
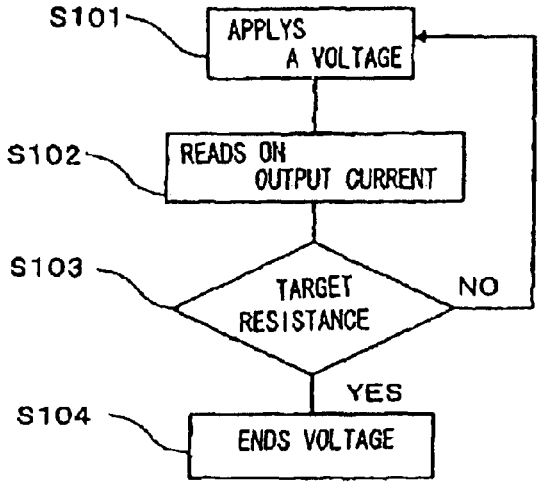
FIG. 7 is a flowchart of a sequence for the feedback control of a gate voltage.

In order to cause the switching element to transit between the on state and the off state, the period of time for which the gate voltage is applied or the applied voltage may be controlled to equalize the resistance between source electrode 11 and drain electrode 12 to a desired target resistance according to the following feedback control process:

FIG. 7 is a flowchart of a feedback control process for controlling the gate voltage. In an experiment, the feedback control process is performed by a personal computer (hereinafter referred to as PC). The PC has a CPU (Central Processing Unit) for performing predetermined processes according to a program and a memory for storing the program.

As shown in FIG. 7, when a predetermined voltage is applied to gate electrode 3 (step S101), the PC reads an output current serving as a drain current (step S102), determines the resistance between the two electrodes from the value of the applied voltage and the value of the read output current, and compares the determined resistance with a preset target resistance (step S103). The PC stores the value of the voltage applied to gate electrode 13, the time for which the voltage is applied to gate electrode 13, and the determined resistance as data in the memory.

If the determined resistance agrees with the target resistance within a predetermined range in step S103, then the PC ends the application of voltage (step S104). If the determined resistance docs not fall in the predetermined range in step S103, then control returns to step S101 in which the voltage is applied.

The time required to perform one processing cycle according to the flowchart shown in FIG. 7 is about 100 ms. However, if a dedicated electric circuit is employed, then the time required to perform one processing cycle may be reduced to 100 ns or shorter.

By thus feeding back the value of the voltage applied to the gate electrode, not only the switching element is caused to transit reliably between the on state and the off state, but also the on-resistance of the switching element and the off resistance thereof, which is the resistance of the switching element when it is in the off state, can be determined more accurately.

A process of manufacturing the switching element of the above structure will be described below.

After a silicon oxide film is formed to a thickness of 300 nm on a semiconductor substrate, a copper film is formed to a thickness of 150 nm on the silicon oxide film by vacuum evaporation. Then, a resist having a predetermined pattern is formed on the copper film by lithography, and then the area of the copper film which is not covered with the resist is removed by ion milling, thus forming gate electrode 13. Therefore, ion conductor 14 of copper sulfide is formed to a thickness of 100 nm on gate electrode 13 by anodic polarization.

Anodic polarization will be described in detail below. In an aqueous solution containing 0.025 mol/L of sodium sulfide, gate electrode 13' including copper as a metal to be sulfided is used as an anode and a gold electrode is used as a cathode. When a voltage is applied between gate electrode 13 and the gold electrode, sulfur ions in the aqueous solution are attracted to the anode, and copper on the surface of gate electrode 13 turns into copper sulfide due to an electrochemical reaction. While the progress of sulfidation is being monitored by measuring the ion current, ion conductor 14 is formed to a desired film thickness.

After ion conductor 14 is formed, a titanium film is formed to a thickness of 10 nm on ion conductor 14 by sputtering, and then a gold film is formed to a thickness of 100 nm on the titanium film by vacuum evaporation. After a resist having a predetermined pattern is formed on the gold film by lithography, the assembly is dry-etched to form source electrode 11 and drain electrode 12. Thereafter, the resist is removed. When source electrode 11 and drain electrode 12 are formed, an interelectrode gap having a size of 100 nm or less is defined therebetween.

While the titanium film is formed by sputtering in the above example, it may be formed by vacuum evaporation. Lift-off may be used instead of dry etching to form source electrode 11 and drain electrode 12.

Methods other than anodic polarization may be employed to form copper sulfide. For example, copper may be reacted with sulfur at a temperature of 200° C. or higher in a gas phase to form copper sulfide. Alternatively, a film of copper sulfide may be grown by laser ablation.

According to the present embodiment, the switching element is formed on substrate 15 covered with silicon oxide film. However, the switching element according to the present embodiment may be formed on an insulating film which covers MOS transistors and interconnects formed on the surface of the substrate. This is because even if the switching element is formed on the insulating film, it does not essentially affect the characteristics of the MOS transistors and the interconnects since heat treatment is performed at a temperature of 400° C. or lower in the process of fabricating the switching element. It is also possible to form another switching element on an insulating film that is formed on the switching element. Consequently, the switching element according to the present invention allows a circuit which incorporates the switching element to be highly integrated.

The structure of the switching element shown in FIG. 5 is illustrative only. Switching elements of other structures are possible without departing from the scope of the invention. Other structures of switching elements are shown in FIGS. 8A through 8C.

Figure 8A:
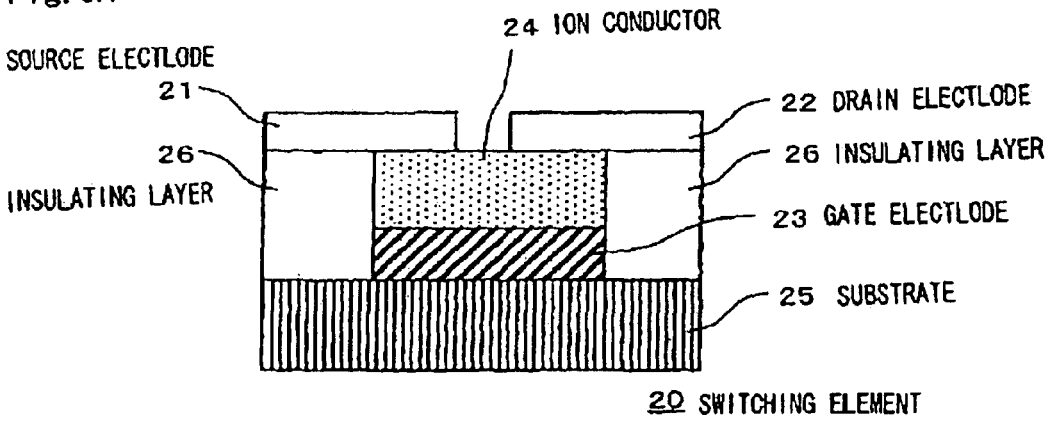
FIG. 8A is a cross-sectional view of another structure of the switching element according to the first embodiment.

In FIG. 8A, a switching element is of a recessed structure wherein the ion conductor and the gate electrode of the switching element shown in FIG. 5 are embedded in insulating layer 26. An opening is defined above substrate 25 covered with a silicon oxide film, and gate electrode 23 and ion conductor 24 are successively disposed in the opening. Source electrode 21 and drain electrode 22 are disposed on ion conductor 24. The gap or distance between source electrode 21 and drain electrode 22 is the same as that shown in FIG. 5. With the recessed structure, if a plurality of switching elements are formed, insulating layers 26 that electrically insulate adjacent ones of the switching elements have upper surfaces lying flush with each other, allowing interconnects connected to source electrode 21 and drain electrode 22 lowing interconnects connected to source electrode 21 and drain electrode 22 on insulating layers 26 to be planar and hence less liable to be broken.

Figure 8B:
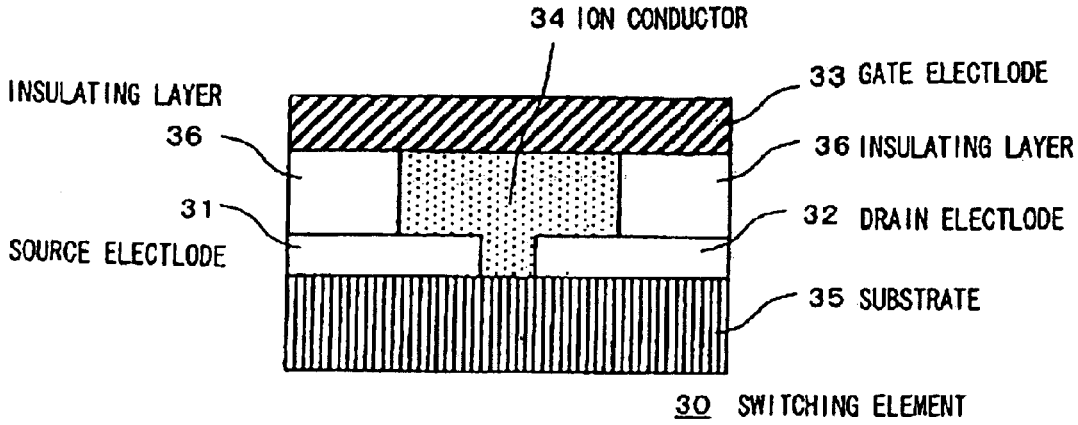
FIG. 8B is a cross-sectional view of still another structure of the switching element according to the first embodiment.

In FIG. 8B, the gate electrode, the source electrode, and the drain electrode in the switching element shown in FIG. 8A are vertically reversed. This arrangement is characterized in that ion conductor 34 is also disposed in the gap between source electrode 31 and drain electrode 32.

Figure 8C:
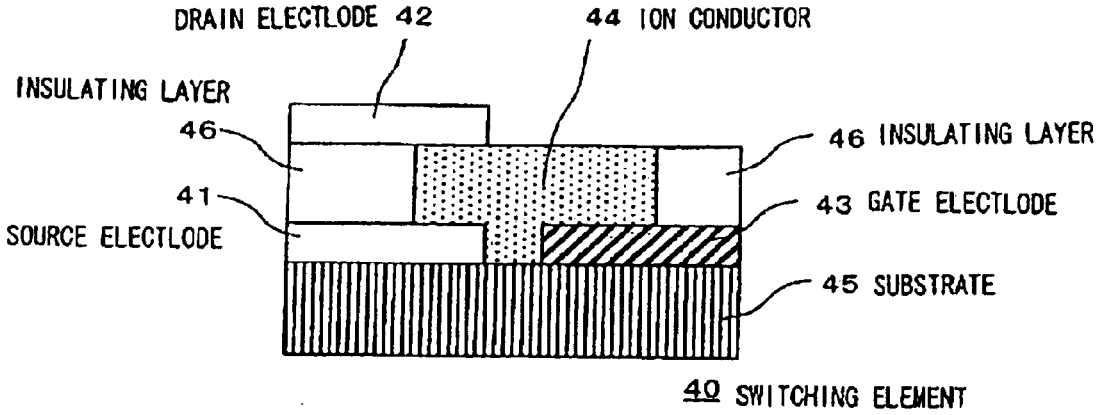
FIG. 8C is a cross-sectional view of yet another structure of the switching element according to the first embodiment.

In FIG. 8C, source electrode 41 and gate electrode 43 are disposed in one interconnect layer, and drain electrode 42 is disposed in a different interconnect layer that is positioned across ion conductor 44 from the above interconnect layer. The size of the gap between drain electrode 42 and source electrode 41 can be established by the film thickness of ion conductor 44.

Figure 9:
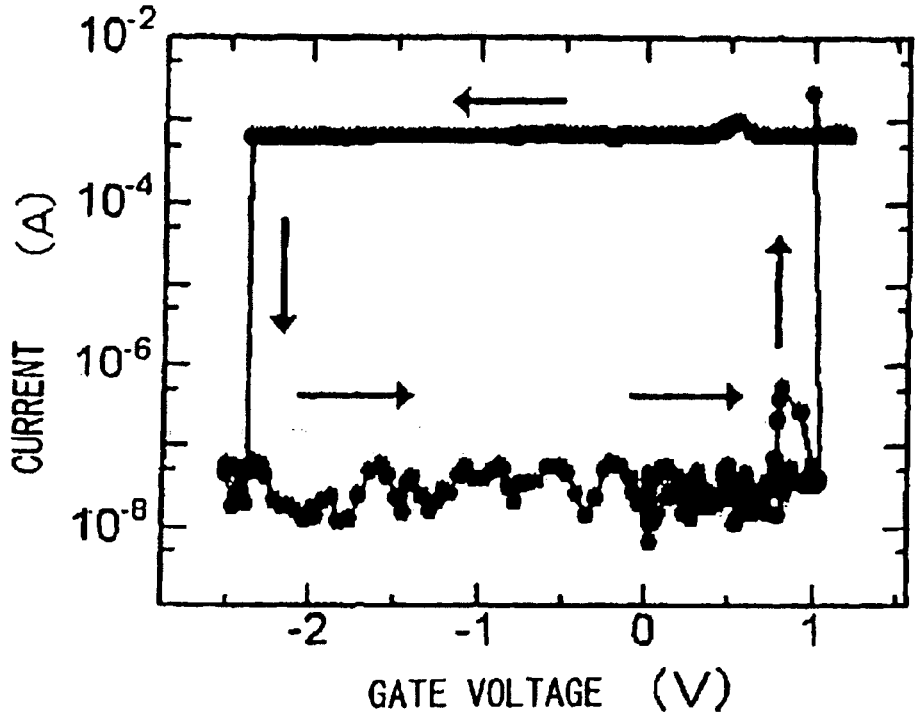
FIG. 9 is a graph showing electrical characteristics of the switching element according to the first embodiment in which an ion conductor is made of copper sulfide produced by anodic polarization.

FIG. 9 shows electrical characteristics of the switching element according to the present embodiment where copper sulfide is produced by anodic polarization. Source electrode 11 is grounded, a voltage of +0.1 V is applied to drain electrode 12, and a positive voltage is applied to gate electrode 13. A current flowing between source electrode and drain electrode is observed, causing the switching element to transit to the on state. When a negative voltage is applied to gate electrode, the current is reduced, causing the switching element to transit to the off state. Then, after the switching element has transited to the off state, when a positive gate voltage is applied, the current flowing between source electrode and drain electrode is increased.

Figure 10:
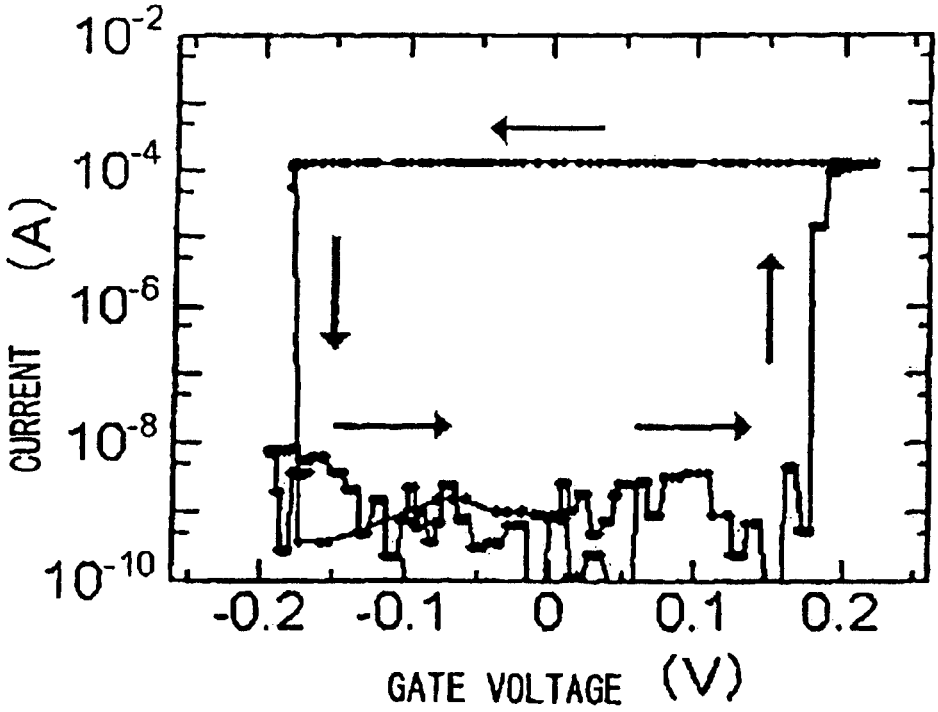
FIG. 10 is a graph showing electrical characteristics of the switching element according to the first embodiment in which an ion conductor is made of copper sulfide produced by laser ablation.

FIG. 10 shows electrical characteristics of the switching element according to the present embodiment where copper sulfide is produced by laser ablation. Source electrode 11 is grounded, a voltage of +0.01 V is applied to drain electrode 12, and a positive voltage is applied to gate electrode 13. A current flowing between source electrode and drain electrode is observed, causing the switching element to transit to the on state. When a negative voltage is applied to gate electrode, the current is reduced, causing the switching element to transit to the off state. Then, after the switching element has transited to the off state, when a positive gate voltage is applied, the current flowing between source electrode and drain electrode is increased.

2nd Embodiment

The present embodiment is characterized in that the drain electrode in the first embodiment is formed of the same material as that of the gate electrode.

An arrangement of the switching element according to the present embodiment will be described below.

Figure 11:
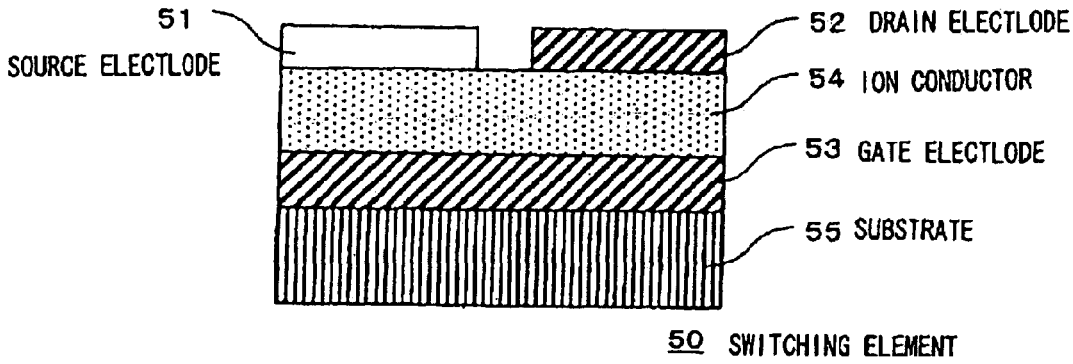
FIG. 11 is a cross-sectional view of a structure of a switching element according to the second embodiment of the present invention.

FIG. 11 is a cross-sectional view of a structure of the switching element according to the present embodiment.

As shown in FIG. 11, switching element 50 has gate electrode 53 disposed on substrate 55 covered with an insulating film, ion conductor 54 disposed on gate electrode 53, and source electrode 51 and drain electrode 52 disposed on ion conductor 54. Source electrode 51, drain electrode 52, and gate electrode 53 are electrically insulated from each other.

Source electrode 51 and drain electrode 52 are disposed within one plane. Gate electrode 53 and drain electrode 52 include a material for supplying metal ions to ion conductor 54 based on an electrochemical reaction. Each of source electrode 51 and ion conductor 54 is made of the same material as with the first embodiment, and will not be described in detail below.

Operation of the two-electrode switching element based on source electrode 51 and drain electrode 52 will be described below.

When source electrode 51 is grounded and a positive voltage is applied to drain electrode 52, a metal filament grows due to copper precipitated between source electrode 51 and drain electrode 52, electrically interconnecting source electrode 51 and drain electrode 52 to bring switching element into the on state. After switching element has been brought into the on state, a negative voltage is applied to drain electrode 52, dissolving the metal filament between source electrode 51 and drain electrode 52 into ion conductor 54, disconnecting source electrode 51 and drain electrode 52 to bring switching element into the off state.

Operation of an arrangement similar to the above two-electrode switching element has been disclosed in the art (Applied Physics Letter, Vol. 82, No. 18, p. 3032 through 3034). The present embodiment resides in that the magnitude of the drain current is controlled by gate electrode 53.

Operation of the switching element of the above arrangement will be described below.

After the voltage is applied to drain electrode 52 to interconnect source electrode 51 and drain electrode 52 with the metal filament, thereby bringing the switching element into the on state, as described above, a positive voltage is applied to gate electrode 53, reducing the on-resistance and increasing the drain current. The reasons for the reduced on-resistance and the increased drain current are as follows: When the switching element is brought into the on state with source electrode 51 and drain electrode 52 being interconnected, since the on-resistance is reduced, the voltage is less liable to be applied to drain voltage 52, thus failing to increase the precipitated amount of copper. However, when a positive voltage is applied to gate electrode 53, it precipitates more copper between source electrode 51 and drain electrode 52, thereby reducing the on-resistance.

After switching element has been brought into the on state, when a negative voltage is applied to gate electrode 53, the drain current is reduced, thus removing the metal filament in order to increase the on-resistance and further to bring switching element into the off state.

According to a specific example, if the on-resistance has a value of 10Ω and the drain voltage has a value of 0.1 V, then the drain current has a value of 10 mA. The current value of 10 mA is very high in semiconductor integrated circuits that have minute interconnect widths, tending to burn off interconnects unless they are thick enough and also to break interconnects due to the motion of atoms in the interconnects (electromigration). When a voltage is applied to gate electrode 53 while switching element is in the on state, it is possible to control the on-resistance to prevent an excessive drain current from flowing.

Immediately before a metal filament interconnects source electrode 51 and drain electrode 52 when a predetermined positive voltage is applied to drain current 52 for a predetermined period of time, a voltage is applied to gate electrode 53 to bring switching element into the on state. At this time, the voltage applied to gate electrode 53 may be small, thus solving the problem of the two-electrode switching element in which too large a drain current flows when the switching element is brought into the on state. It is necessary to check in advance the predetermined positive voltage that is applied to drain electrode 52 and the predetermined period of time for which it is applied immediately before a metal filament interconnects source electrode 51 and drain electrode 52, and also to set the timing to apply the voltage to gate electrode 53.

In the present embodiment, a voltage may be applied between source electrode 51 and drain electrode 52 or a voltage may be applied to gate electrode 53 in order to electrically interconnect source electrode 51 and drain electrode 52.

A process of manufacturing the switching element according to the present embodiment will be described below. Those steps of the manufacturing process which are identical to those of the first embodiment will not be described in detail below.

After gate electrode 53 and ion conductor 54 are formed as with the first embodiment, a titanium film is formed to a thickness of 10 nm by sputtering, and a gold film is formed to a thickness of 100 nm by vacuum evaporation. Then, a resist having a predetermined pattern is formed on the gold film by lithography, and then the assembly is dry-etched to form source electrode 51 and the resist is removed. Thereafter, a copper film is formed to a thickness of 100 nm by vacuum evaporation. Then, a resist having a predetermined pattern is formed on the copper film by lithography. Thereafter, the area of the copper film which is not covered with the resist is removed by ion milling, thus forming drain electrode 52, and the resist is removed. The gap between source electrode 51 and drain electrode 52 has a size of 100 nm or less.

While the titanium film is formed by sputtering in the above example, it may be formed by vacuum evaporation. Lift-off may be used instead of dry etching to form source electrode 51 and drain electrode 52. As with the first embodiment, methods other than anodic polarization may be employed to form copper sulfide.

The switching element according to the present embodiment is illustrative only. Switching elements of other structures are possible without departing from the scope of the invention. With the exception that the drain electrode is made of the same material as the gate electrode, the structure, layout, and the manufacturing method described above with respect to the first embodiment may be applied to the present embodiment.

3rd Embodiment

An arrangement of an FPL circuit which incorporates switching elements according to the present invention will be described below.

As described in the background art, the FPL circuit has a plurality of logic circuit blocks, interconnects that interconnect the logic circuit blocks, and antifuse elements for changing the connection of the interconnects. According to the present embodiment, switching elements according to the present invention are used as programming elements instead of as antifuse elements.

Figure 12:
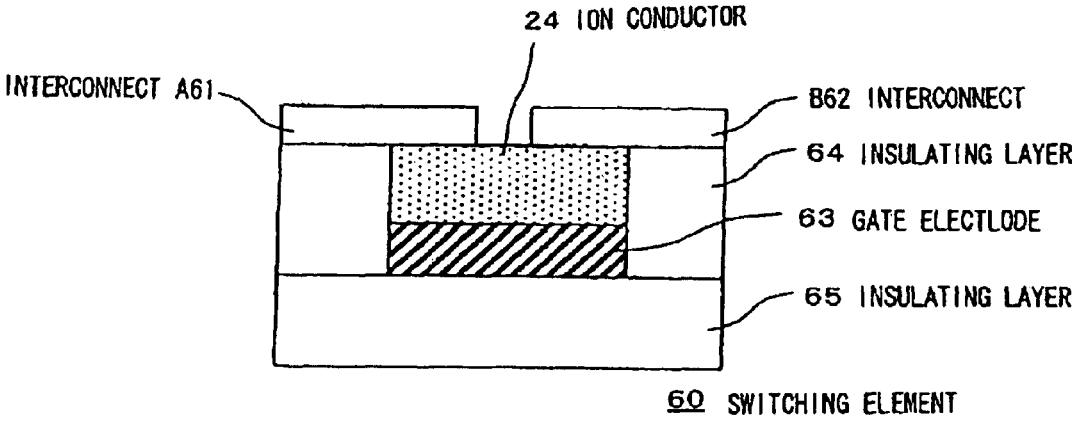
FIG. 12 is a cross-sectional view showing a structure of a switching element according to the present invention as it is applied to an FPL circuit.

FIG. 12 is a cross-sectional view showing a structure of a switching element according to the present invention as it is applied to an FPL circuit.

The structure shown in FIG. 12 is similar to the first embodiment shown in FIG. 8A except that source electrode 21 in FIG. 8A is replaced with interconnect A61 and drain electrode 22 in FIG. 8A is replaced with interconnect B62, Operation of the switching element shown in FIG. 12 will be described below.

Interconnects A61, B62 are grounded and a positive voltage is applied to gate electrode 63 or a negative voltage is applied to interconnects A61, B62 and gate electrode 63 is grounded, precipitating copper between interconnects A61, B62 to electrically connect interconnects A61, B62 to each other. Interconnects A61, B62 are grounded and a negative voltage is applied to gate electrode 63 or a positive voltage is applied to interconnects A61, B62 and gate electrode 63 is grounded, dissolving the precipitated copper to electrically disconnect interconnects A61, B62 from each other.

The switching elements for use in an FPL circuit may be of the structure of the first embodiment shown in FIG. 8A or the structure of the second embodiment.

A process of manufacturing the switching element shown in FIG. 12 will be described below. Those steps of the manufacturing process which are identical to those of the first and second embodiments will not be described in detail below.

Insulating layer 65 is formed on a substrate on which logic circuit blocks and peripheral circuits have been formed. Then, insulating layer 64 having an opening defined therein is formed on insulating layer 65, and gate electrode 63 and ion conductor 24 are successively formed in the opening. Thereafter, interconnects A61, B62 are formed respectively in place of source electrode 21 and drain electrode 22 shown in FIG. 8A.

In an experiment, the FPL circuit which incorporates the switching elements according to the present invention was capable of performing at least several million rewriting cycles. Any signal delay caused by the FPL circuit is small because the on-resistance of the switching elements is small. The FPL circuit is better than an FPL circuit employing conventional antifuse elements because it is rewritable, and is better than an FPL circuit employing EEPROMs because it causes a smaller signal delay.

4th Embodiment

An arrangement of a memory device employing switching elements according to the present invention as information storage means will be described below.

Figure 13:
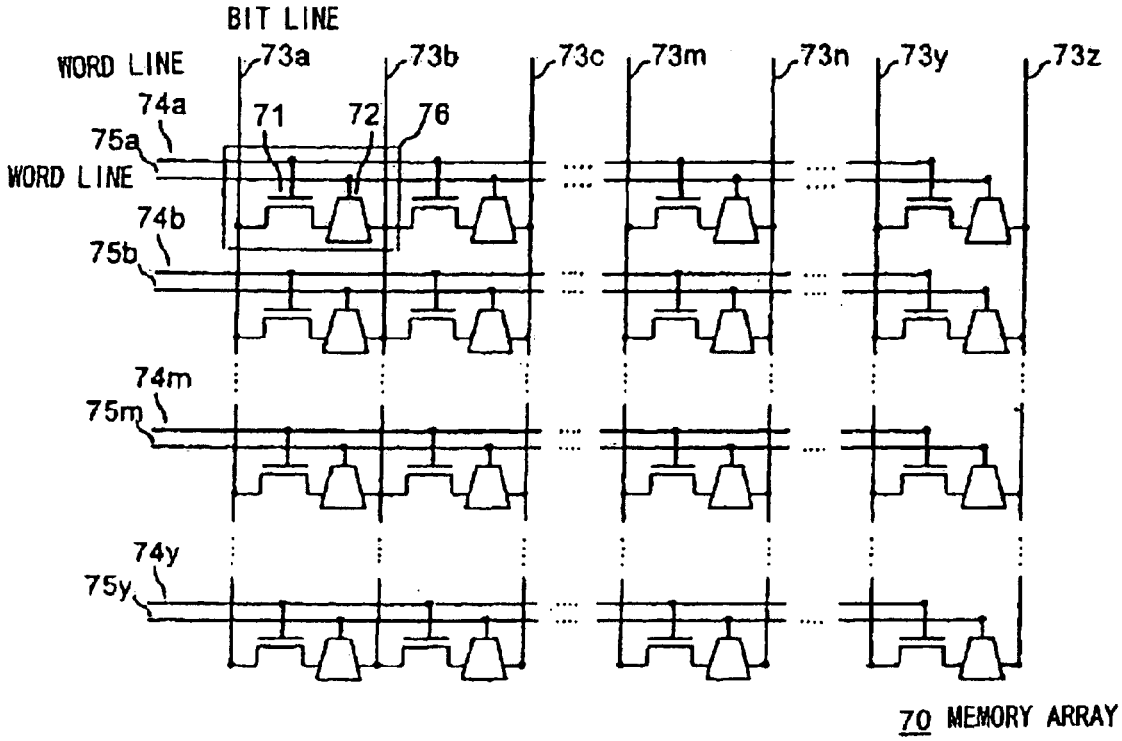
FIG. 13 is a circuit diagram of a memory device comprising switching elements according to the present invention and MOS transistors.

FIG. 13 is a circuit diagram of a memory device employing switching elements according to the present invention.

As shown in FIG. 13, the memory device includes memory array 70 having an array of memory cells, bit lines 73a through 73z, word lines 74a through 74y, and word lines 75a through 75y. Memory cell 76, like other memory cells, has cell-selecting MOS transistor 71 and switching element 72. Each of the bit lines and each of the word lines are connected respectively to a decoder circuit and a driver circuit (not shown). Bit lines are shared by adjacent memory cells. Memory array 70 and peripheral circuits (not shown) including the decoder circuits and the driver circuits make up an integrated memory circuit.

In memory cell 76, MOS transistor has a source electrode connected to bit line 73a and a gate electrode to word line 74a. Switching element 72 has a source electrode connected to bit line 73b and a gate electrode to word line 75a. The drain electrode of switching element 72 is connected to the drain electrode of MOS transistor 71.

Operation of the memory device thus constructed will be described below. Of stored information "1", "0", the stored information "1" is represented by the on state of a switching element, and the stored information "0" is represented by the off state of a switching element. A voltage required by a switching element to transit between the on state and the off state, i.e., the difference between a gate voltage and a voltage applied to the source electrode, is represented by Vt, and an operating voltage of MOS transistor 71 by VR.

For writing "1" in memory cell 76, the voltage Vt is applied to word line 75a that is connected to the gate electrode of switching element 72 of memory cell 76, and a voltage of 0 V is applied to bit line 73b that is connected to the source electrode of switching element 72. A voltage Vt/2 is applied to word lines 75b through 75y and bit lines 73a, 73c through 73z. As described above with respect to the first embodiment and the second embodiment, switching element 72 is brought into the on state, writing the stored information "1" therein. At this time, no stored information is written in the other switching elements except for switching element 72, and these other switching elements hold a state prior to the application of the voltage.

For writing "0" in memory cell 76, the voltage applied to word line 75a that is connected to the gate electrode of switching element 72 of memory cell 76 is set to 0 V, and the voltage Vt is applied to bit line 73b that is connected to the source electrode of switching element 72. The voltage Vt/2 is applied to word lines 75b through 75y and bit lines 73a, 73c through 73z. As described above with respect to the first embodiment and the second embodiment, switching element 72 is brought into the off state, writing the stored information "0" therein. The other switching elements except for switching element 72 hold a state prior to the application of the voltage.

For reading the stored information from memory cell 76, the voltage VR is applied to word line 74a to turn on MOS transistor 71, and the voltage applied to the other word lines is set to 0 V, and the resistance between bit lines 73a, 73b is determined. This resistance represents the combination of the on-resistance of MOS transistor 71 and the resistance of switching element 72. If this combined resistance is too large to be measured, then switching element 72 can be judged as being in the off state, indicating that the stored information in memory cell 76 is "0". If the combined resistance is smaller than a predetermined value, then switching element 72 can be judged as being in the on state, indicating that the stored information in memory cell 76 is "1".

MOS transistor in each memory cell may be replaced with a diode.

The present invention is not limited to the above embodiments but various changes and modifications may be made and should be interpreted as falling within the scope of the present invention.

The invention claimed is:

1. A switching element comprising[:] an ion conductor capable of conducting metal ions therein[;], a first electrode [and a second electrode which are disposed in contact with said ion conductor; and a third electrode disposed in contact with said ion conductor and including said metal ions; wherein an interelectrode distance L1 between said first electrode and said second electrode, an interelectrode distance L2 between said first electrode and said third electrode, and an interelectrode distance L3 between said second electrode and said third electrode satisfy the condition according to the expression:

$$L1<L2\times2 \text{ and } L1<L3\times2$$

], *a second electrode, and a third electrode;*

*wherein said first electrode is of a structure including a region made of a material that is not capable of supplying said metal ions to said ion conductor;*

*at least one or two electrodes from among said second electrode and said third electrode is/are held in contact with said ion conductor, and at least one or two electrodes held in contact with said ion conductor is/are of a structure including a material capable of supplying said metal ions to said ion conductor; and*

*wherein the first, second and third electrodes are arranged such that an electrical conductivity between said first electrode and said second electrode is controlled by applying a voltage to said third electrode.*

[2. The switching element according to claim 1, wherein the interelectrode distance between said first electrode and said second electrode is 0.5 μm or less.]

3. A switching element [disposed on a substrate covered with an insulating film or an insulating substrate,] comprising[:] an ion conductor capable of conducting metal ions therein[;], a first electrode [and a second electrode which are disposed in contact with said ion conductor; and a third electrode disposed in contact with said ion conductor and including a metal dissolvable into said ion conductor based on an electrochemical reaction; wherein an interelectrode distance L1 between said first electrode and said second electrode, an interelectrode distance L2 between said first electrode and said third electrode, and an interelectrode distance L3 between said second electrode and said third electrode satisfy the condition according to the expression:

$$L1<L2\times2 \text{ and } L1<L3\times2$$

], *a second electrode, and a third electrode;*

*wherein said first electrode, said second electrode, and said third electrode are held in contact with said ion conductor;*

*said first electrode is of a structure including a region made of a material that is not capable of supplying said metal ions to said ion conductor;*

*at least one or two electrodes from among said second electrode and said third electrode is/are of a structure including a material capable of supplying said metal ions to said ion conductor; and*

*wherein the first, second and third electrodes are arranged such that an electrical conductivity between said first electrode and said second electrode is controlled by applying a voltage to said third electrode.*

[4. The switching element according to claim 3, wherein:

said first electrode and said second electrode are disposed on said substrate in spaced-apart relation to each other, and the interelectrode distance between said first electrode and said second electrode is 0.5 μm or less;

said ion conductor is disposed to cover said first electrode and said second electrode; and said third electrode is disposed on said ion conductor.]

[5. The switching element according to claim 3, wherein:

said third electrode is disposed on said substrate;

said ion conductor is disposed on said third electrode; and said first electrode and said second electrode are disposed on said ion conductor in spaced-apart relation to each other, and the interelectrode distance between said first electrode and said second electrode is 0.5 μm or less.]

[6. The switching element according to claim 3, wherein:

said first electrode and said third electrode are disposed on said substrate;

said ion conductor is disposed on said first electrode and said third electrode; and said second electrode is disposed on said ion conductor, and the interelectrode distance between said first electrode and said second electrode is equal to or on the order of a film thickness of said ion conductor.]

[7. The switching element according to claim 1, wherein an electrical characteristic between said first electrode and said second electrode is controlled by applying a voltage to said third electrode.]

[8. The switching element according to claim 3, wherein an electrical characteristic between said first electrode and said second electrode is controlled by applying a voltage to said third electrode.]

[9. The switching element according to claim 7, wherein said electrical characteristic represents electric conductivity.]

[10. The switching element according to claim 8, wherein said electrical characteristic represents electric conductivity.]

[11. The switching element according to claim 1, wherein:

said first electrode and said second electrode are electrically interconnected to bring the switching element into an on state by applying a voltage, which is positive with respect to at least one of said first electrode and said second electrode, to said third electrode; and said first electrode and said second electrode are insulated from each other to bring the switching element into an off state by applying a voltage, which is negative with respect to at least one of said first electrode and said second electrode, to said third electrode.]

[12. The switching element according to claim 3, wherein:

said first electrode and said second electrode are electrically interconnected to bring the switching element into an on state by applying a voltage, which is positive with respect to at least one of said first electrode and said second electrode, to said third electrode; and said first electrode and said second electrode are insulated from each other to bring the switching element into an off state by applying a voltage, which is negative with respect to at least one of said first electrode and said second electrode, to said third electrode.]

13. The switching element according to claim 1, wherein *at least one or two electrodes from among* said second electrode *and said third electrode* includes [a metal dissolvable into said ion conductor based on an electrochemical reaction] *include a portion held in contact with at least said ion conductor, said portion being of a composition capable of supplying said metal ions to said ion conductor.*

[14. The switching element according to claim 3, wherein said second electrode includes a metal dissolvable into said ion conductor based on an electrochemical reaction.]

[15. The switching element according to claim 13, wherein:

said first electrode and said second electrode are electrically interconnected to bring the switching element into an on state by either applying a voltage, which is positive with respect to said first electrode, to said second electrode, or applying a voltage, which is positive with respect to at least one of said first electrode and said second electrode, to said third electrode; and said first electrode and said second electrode are insulated from each other to bring the switching element into an off state by either applying a voltage, which is negative with respect to said first electrode, to said second electrode, or applying a voltage, which is negative with respect to at least one of said first electrode and said second electrode, to said third electrode.]

[16. The switching element according to claim 14, wherein:

said first electrode and said second electrode are electrically interconnected to bring the switching element into an on state by either applying a voltage, which is positive with respect to said first electrode, to said second electrode, or applying a voltage, which is positive with respect to at least one of said first electrode and said second electrode, to said third electrode; and said first electrode and said second electrode are insulated from each other to bring the switching element into an off state by either applying a voltage, which is negative with respect to said first electrode, to said second electrode, or applying a voltage, which is negative with respect to at least one of said first electrode and said second electrode, to said third electrode.]

17. The switching element according to claim 1, wherein at least one of [said first electrode, said second electrode, and said third electrode has] *the electrodes held in contact with said ion conductor includes* a pointed portion on a surface thereof held in contact with said ion conductor.

[18. The switching element according to claim 3, wherein at least one of said first electrode, said second electrode, and said third electrode has a pointed portion on a surface thereof held in contact with said ion conductor.]

19. The switching element according to claim 1, wherein said ion conductor comprises either a calcogenide material including an element belonging to the group 6B of the periodic table, or metal ionic glass, or metal ionic amorphous semiconductor.

[20. The switching element according to claim 3, wherein said ion conductor comprises either a calcogenide material including an element belonging to the group 6B of the periodic table, or metal ionic glass, or metal ionic amorphous semiconductor.]

21. The switching element according to claim 1, wherein[:] said ion conductor [and said third electrode are made of] *includes* either copper sulfide [and copper, respectively,] or [of silver sulfide and silver, respectively; and portions of said first electrode and said second electrode which are held in contact with said ion conductor are made of either a metal such as platinum, aluminum, gold, titanium, tungsten, vanadium, niobium, tantalum, chromium, or molybdenum, a nitride of the metal, or a silicide of the metal, or a combination thereof] *silver sulfide*.

[22. The switching element according to claim 3, wherein:

said ion conductor and said third electrode are made of either copper sulfide and copper, respectively, or of silver sulfide and silver, respectively; and portions of said first electrode and said second electrode which are held in contact with said ion conductor are made of either a metal such as platinum, aluminum, gold, titanium, tungsten, vanadium, niobium, tantalum, chromium, or molybdenum, a nitride of the metal, or a silicide of the metal, or a combination thereof.]

[23. The switching element according to claim 13, wherein:

said ion conductor and said third and second electrodes are made of either copper sulfide and copper, respectively, or of silver sulfide and silver, respectively; and a portion of said first electrode which is held in contact with said ion conductor is made of either a metal such as platinum, aluminum, gold, titanium, tungsten, vanadium, niobium, tantalum, chromium, or molybdenum, a nitride of the metal, or a silicide of the metal, or a combination thereof.]

[24. The switching element according to claim 14, wherein:

said ion conductor and said third and second electrodes are made of either copper sulfide and copper, respectively, or of silver sulfide and silver, respectively; and a portion of said first electrode which is held in contact with said ion conductor is made of either a metal such as platinum, aluminum, gold, titanium, tungsten, vanadium, niobium, tantalum, chromium, or molybdenum, a nitride of the metal, or a silicide of the metal, or a combination thereof.]

[25. The switching element according to claim 1, wherein said ion conductor comprises an electrolytic solution.]

[26. The switching element according to claim 3, wherein said ion conductor comprises an electrolytic solution.]

27. The method of driving a switching element according to claim [7] *43*, comprising the step of:

controlling [said] *an* electrical characteristic *between said first electrode and said second electrode,* based on the voltage applied to said third electrode and/or a period of time for which the voltage is applied to said third electrode.

[28. The method of driving a switching element according to claim 8, comprising the step of:

controlling said electrical characteristic based on the voltage applied to said third electrode and/or a period of time for which the voltage is applied to said third electrode.]

29. The method of driving a switching element according to claim [11] *43*, comprising the [steps of: selectively bringing said switching element into said on state and said off state depending on the polarity of the voltage applied to said third electrode; and] *step of:* holding said switching element in either said on state or said off state [even if no] *by stopping application of the* voltage [is applied] to said third electrode.

[30. The method of driving a switching element according to claim 12, comprising the steps of:

selectively bringing said switching element into said on state and said off state depending on the polarity of the voltage applied to said third electrode; and holding said switching element in either said on state or said off state even if no voltage is applied to said third electrode.]

[31. The method of driving a switching element according to claim 15, comprising the steps of:

selectively bringing said switching element into said on state and said off state depending on the polarity of the voltage applied to said third electrode; and holding said switching element in either said on state or said off state even if no voltage is applied to said third electrode.]

[32. The method of driving a switching element according to claim 16, comprising the steps of:

selectively bringing said switching element into said on state and said off state depending on the polarity of the voltage applied to said third electrode; and holding said switching element in either said on state or said off state even if no voltage is applied to said third electrode.]

33. The method of driving a switching element according to claim [11, comprising the steps of: when said switching element is caused to transit between said on state and said off state, measuring] *43, wherein* the conductivity between said first [electrode] and [said] second [electrode; and controlling] *electrodes is measured, and* the voltage applied to [said] *the* third electrode *is controlled* based on a change in the conductivity.

[34. The method of driving a switching element according to claim 12, comprising the steps of:

when said switching element is caused to transit between said on state and said off state, measuring the conductivity between said first electrode and said second electrode; and controlling the voltage applied to said third electrode based on a change in the conductivity.]

[35. The method of driving a switching element according to claim 15, comprising the steps of:

when said switching element is caused to transit between said on state and said off state, measuring the conductivity between said first electrode and said second electrode; and controlling the voltage applied to said third electrode based on a change in the conductivity.]

[36. The method of driving a switching element according to claim 16, comprising the steps of:

when said switching element is caused to transit between said on state and said off state, measuring the conductivity between said first electrode and said second electrode; and controlling the voltage applied to said third electrode based on a change in the conductivity.]

37. [The rewritable] *A* logic integrated circuit incorporating a switching element, according to claim [7] *1*, as a [programming] *programmable* switch.

[38. The rewritable logic integrated circuit incorporating a switching element according to claim 8 as a programming switch.]

39. [The] *A* memory [device having] *element including a* memory [cells each] *cell as a basic unit* comprising a switching element according to claim [7] *1* and [either a MOS] *a* transistor or a diode.

[40. The memory device having memory cells each comprising a switching element according to claim 8 and either a MOS transistor or a diode.]

[41. The memory device according to claim 39, wherein:

said memory cell comprises a MOS transistor;

said switching element has said second electrode connected to the drain electrode of said MOS transistor, said first electrode connected to a first bit line, and said third electrode connected to a first word line; and said MOS transistor has a source electrode connected to a second bit line different from said first bit line and a gate electrode connected to a second word line different from said first word line.]

[42. A memory device according to claim 40, wherein:

said memory cell comprises a MOS transistor;

said switching element has said second electrode connected to the drain electrode of said MOS transistor, said first electrode connected to a first bit line, and said third electrode connected to a first word line; and said MOS transistor has a source electrode connected to a second bit line different from said first bit line and a gate electrode connected to a second word line different from said first word line.]

*43. A method of driving a switching element comprising an ion conductor capable of conducting metal ions therein, a first electrode, a second electrode, and a third electrode;*

*wherein said first electrode is of a structure including a region made of a material that is not capable of supplying said metal ions to said ion conductor;*

*said third electrode is held in contact with said ion conductor and is of a structure including a material capable of supplying said metal ions to said ion conductor; and*

*wherein the first, second and third electrodes are arranged such that an electrical conductivity between said first electrode and said second electrode is controlled by applying a voltage to said third electrode;*

*said method comprising the steps of:*

*applying a positive voltage to said third electrode to form an on state in which said first electrode and said second electrode are electrically connected to each other; and*

*applying a negative voltage to said third electrode to form an off state in which said first electrode and said second electrode are insulated from each other.*

*44. A method of driving a switching element comprising an ion conductor capable of conducting metal ions therein, a first electrode, a second electrode, and a third electrode;*

*wherein said first electrode is of a structure including a region made of a material that is not capable of supplying said metal ions to said ion conductor;*

*said second electrode is held in contact with said ion conductor and is of a structure including a material capable of supplying said metal ions to said ion conductor; and*

*wherein the first, second and third electrodes are arranged such that an electrical conductivity between said first electrode and said second electrode is controlled by applying a voltage to said third electrode;*

*said method comprising the steps of:*

*applying a positive voltage to said second electrode to form an on state in which said first electrode and said second electrode are electrically connected to each other, thereafter applying a voltage, which is positive with respect to said first electrode, to said third electrode to increase the amount of current between said first electrode and said second electrode, or applying a voltage, which is negative with respect to said first electrode, to said third electrode to reduce the amount of current between said first electrode and said second electrode; and*

*applying a voltage, whose polarity is opposite to the polarity thereof for forming the on state, to said second electrode to form an off state in which said first electrode and said second electrode are insulated from each other.*

*45. The switching element according to claim 3, wherein said first electrode includes a portion held in contact with at least said ion conductor, said portion being of a composition that is not capable of supplying said metal ions to said ion conductor.*

*46. The switching element according to claim 1, wherein one or two electrodes from among said first electrode, said second electrode, and said third electrode is/are disposed on a substrate.*

*47. The switching element according to claim 46, wherein another electrode is disposed above said electrode or electrodes on said substrate, with at least either said ion conductor or an insulating layer being interposed therebetween.*

*48. The switching element according to claim 1, wherein said region made of a material that is not capable of supplying said metal ions to said ion conductor, is made of either a metal such as platinum, aluminum, gold, titanium, tungsten, vanadium, niobium, tantalum, chromium, or molybdenum, a nitride of the metal, or a silicide of the metal, or a combination thereof.*

* * * * *